Figure 1:
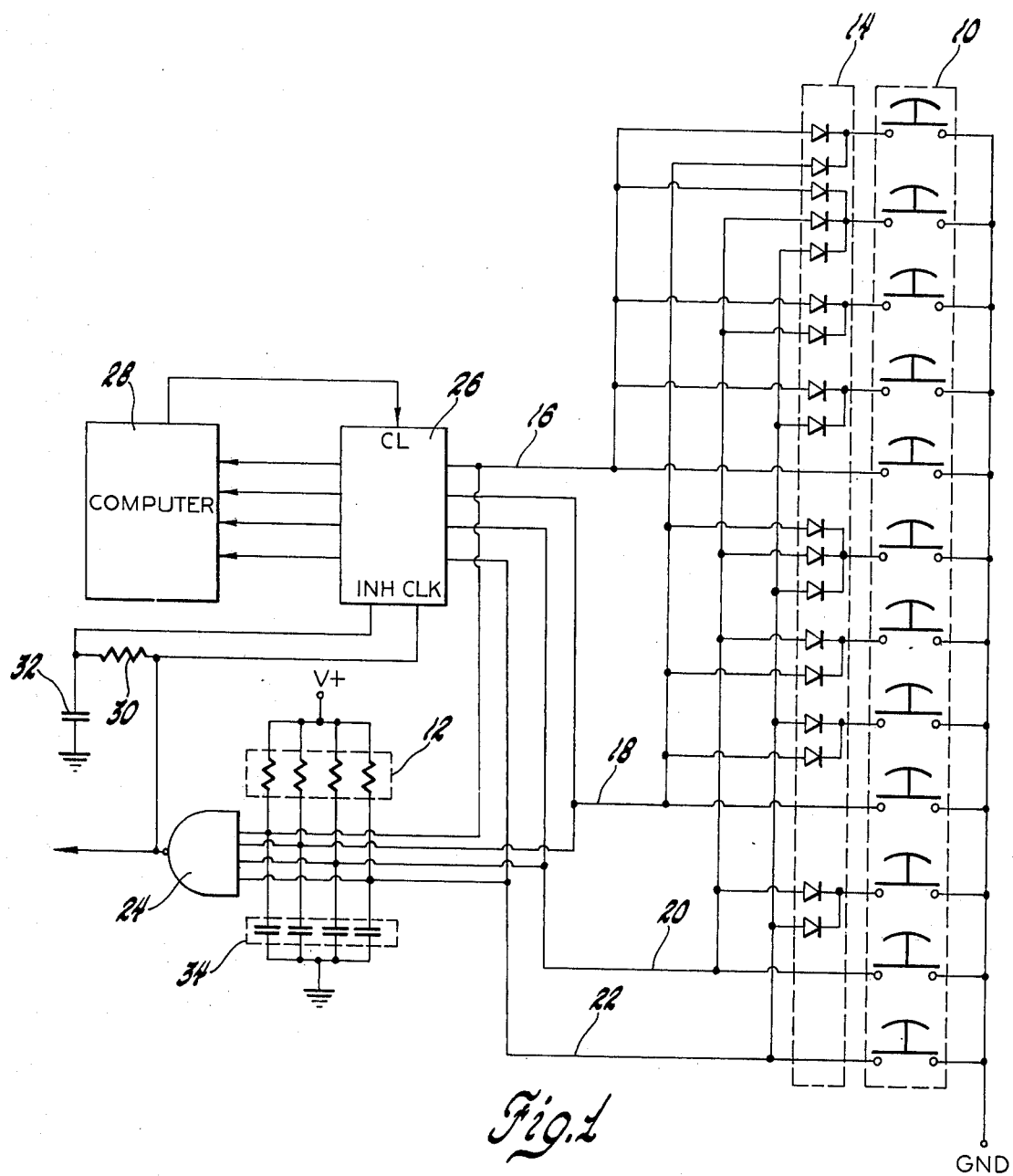

United States Patent [19]

Strandt

[11] 4,015,254
[45] Mar. 29, 1977

[54] KEYBOARD ENCODING CIRCUIT UTILIZING AN A/D CONVERTER

[75] Inventor: Earl R. Strandt, Greendale, Wis.

[73] Assignee: General Motors Corporation, Detroit, Mich.

[22] Filed: Dec. 4, 1975

[21] Appl. No.: 637,517

[52] U.S. Cl. .................. 340/365 S; 340/365 R; 340/347 AD

[51] Int. Cl.² .......................................... G06F 3/02

[58] Field of Search ........ 340/365 R, 365 C, 365 S, 340/365 E, 204, 188 R; 317/347 AD, 136

[56] References Cited

UNITED STATES PATENTS

| | | | |
|---|---|---|---|
| 2,132,213 | 10/1938 | Locke | 340/204 |
| 3,248,696 | 4/1966 | Bloch | 340/365 S |
| 3,530,310 | 9/1970 | Adelson | 340/365 C |
| 3,653,038 | 3/1972 | Webb et al. | 340/365 C |
| 3,836,909 | 9/1974 | Cockerell | 340/365 C |
| 3,928,789 | 12/1975 | Elias | 340/365 S |

Primary Examiner—John W. Caldwell
Assistant Examiner—James J. Groody
Attorney, Agent, or Firm—Albert F. Duke

[57] ABSTRACT

Various switches of a keyboard are connected with a voltage divider network to establish an analog voltage for respective switch closures. The analog voltage is stored on a capacitor and converted by an analog-to-digital converter for input to a computer.

3 Claims, 2 Drawing Figures

KEYBOARD ENCODING CIRCUIT UTILIZING AN A/D CONVERTER

This invention relates to a keyboard encoding circuit and more particularly to a keyboard circuit which develops different predetermined analog voltages for each switch closure on the keyboard and utilizes an analog-to-digital converter for obtaining a digital output code for each switch.

Prior art keyboard encoder circuits such as the so-called diode encoder provide a digital code in response to closure of a key actuated switch. A latch is usually provided which stores the code for subsequent input to a utilization device such as a computer. In addition to the latch and diodes, gating for clocking the latch as well as anti-bounce and noise filtering circuitry is required.

In the automotive environment a keyboard is usually provided for entering certain types of data to the central computer. Other data of an analog nature is multiplexed to an analog-to-digital (A/D) converter and the equivalent digital data is supplied to the computer. Because the analog multiplexer and A/D converter are necessary items to interface the computer with the vehicle sensors, it is desirable to make the greatest use possible of the devices.

In accordance with the present invention, the essentially digital nature of keyboard switch actuation is converted to an analog voltage by a voltage divider network. This voltage is stored on a capacitor and accepted as an additional analog input to the analog multiplexer and is subsequently converted to a digital value by the A/D converter. By so doing, a substantial cost savings is achieved.

Figure 2:
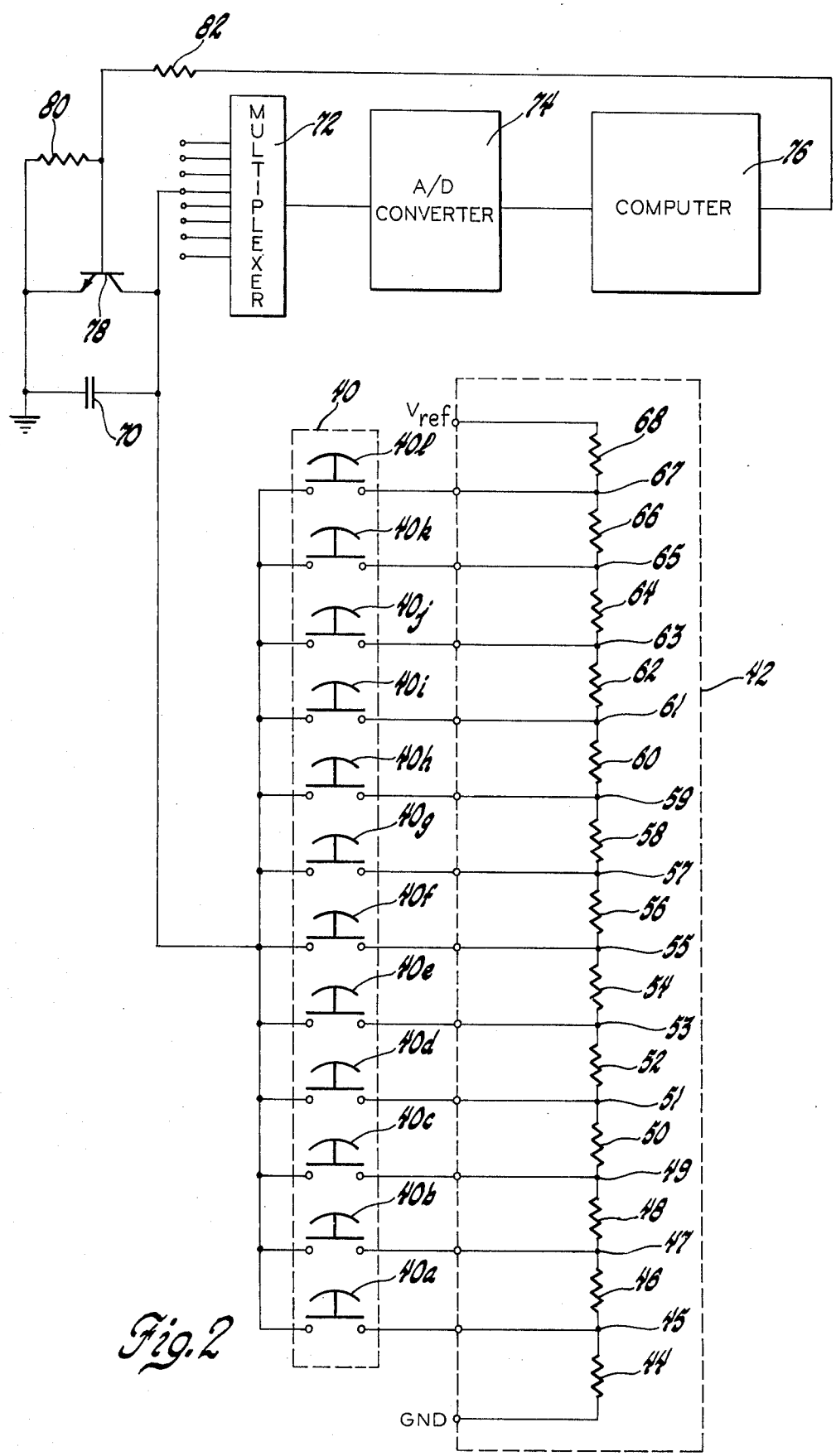

A more complete understanding of the present invention may be had from the following detailed description which should be taken in conjunction with the drawings in which:

FIG. 1 shows a prior art keyboard encoder, FIG. 2 is a schematic diagram of the encoder of the present invention.

Referring now to the drawings and initially to FIG. 1, a prior art keyboard encoder includes twelve key actuated switches generally designated 10. One terminal of each switch is grounded, while the other terminal of each switch is connected with a voltage source V+ through pull-up resistors 12. A total of eighteen diodes generally designated 14 are required to produce a distinct four bit binary code in response to closure of any one of the twelve key actuated switches. The four bit code appears on the conductors 16, 18, 20 and 22 and provide inputs to a NAND gate 24 and a four bit latch 26. Closure of any of the switches 10 grounds at least one input to the gate 24 the output of which is connected with the clock input of the latch 26 to load the four bit code into the latch 26. The output of the latch 26 is available for input to a computer 28 which provides a pulse to the clear input of the latch 26 to clear the latch 26 after the data is entered into the computer. An RC network comprising resistor 30 and capacitor 32 are connected with the inhibit input of the latch 26 to overcome the problems associated with contact bounce. Capacitors 34 are provided for filtering purposes.

Referring now to FIG. 2, the keyboard encoding circuit of the present invention includes switches 40a—40L which are generally designated by the numeral 40. A voltage dividing network generally designated 42 is connected between a source of reference voltage $V_{ref}$ and ground. The network 42 comprises resistors 44–68. Each of the resistors 46–66 having a value of 2R while the resistor 44 has a value of 3R and the resistor 68 has a value of 7R where R equals 100 ohms ± 30%. Thus, the voltage at the junction 45 is 3/32 of $V_{ref}$ and increases by 2/32 $V_{ref}$ at each of the junctions 47–67.

A capacitor 70 is charged to the voltage at one of the junctions 45–67 upon closure of the associated key actuated switch 40. Upon deactuation of the switch 40 the charge on the capacitor 70 is retained. The capacitor 70, in addition to storing the appropriate analog voltage, also serves to filter any noise from the key actuated switches 40. The capacitor 70 is connected at one input to a multiplexer 72 which is provided with various other inputs to which various sensors on the vehicle are connected. The output of the multiplexer 72 is fed to an A/D converter 74 which converts analog voltages at its input to a binary output which is fed to a computer 76. An output of the computer 76 is provided to a switching network comprising an NPN transistor 78 and resistors 80 and 82 which provides a discharge path for the capacitor 70 after the voltage on the capacitor 70 has been converted to a digital value.

While the particular ratios of resistors previously mentioned is not required to practice the invention, they have been found to be particularly appropriate. For example, assuming the A/D converter utilizes the same $V_{ref}$ voltage reference and is an eight bit converter, closure of the switches 40 will produce the output code shown in the following table:

| SWITCHES | CODE |
|---|---|
| 40a | 00011000 |
| 40b | 00101000 |
| 40c | 00111000 |
| 40d | 01001000 |
| 40e | 01011000 |
| 40f | 01101000 |
| 40g | 01111000 |
| 40h | 10001000 |
| 40i | 10011000 |
| 40j | 10101000 |
| 40k | 10111000 |
| 40L | 11001000 |

By deleting the least significant four bits of each code it will be noted that the four bits remaining are the binary equivalent of the digital numbers 1–12 and conveniently identify the twelve switches 40.

Having thus described my invention what I claim is:

1. A keyboard encoding circuit comprising a plurality of manually actuable keyboard switches, a source of voltage, voltage divider means connecting one side of each of said switches with said source for establishing a different predetermined voltage on the other side of each of said switches in response to closure of respective ones of said switches, storage means connected with the other side of each of said switches for storing the voltage associated with closure of a particular keyboard switch, means for converting the voltage stored to a digital value, and means for clearing said storage means subsequent to conversion of said voltage to said digital value.

2. A keyboard encoder circuit comprising a plurality of manually actuable keyboard switches, a source of voltage, a plurality of voltage divider resistors connected with said source and establishing a different value at each of a plurality of junctions, means connecting one side of each of said switches with a respective one of said junctions, a capacitor connected with the other side of each of said switches whereby said capacitor is charged to a voltage associated with closure of a particular keyboard switch, means for converting the voltage stored on said capacitor to a digital value, and means for discharging said capacitor.

3. A keyboard encoding circuit comprising a plurality of manually actuable keyboard switches, a source of voltage, a plurality of voltage divider resistors serially connected across said source for establishing a different voltage at each junction between said resistors, means connecting one side of each of said switches with a respective one of said junctions, a capacitor connected with the other side of each of said switches whereby said capacitor is charged to the voltage established at the junction connected with the particular keyboard switch upon closure of the switch, multiplexing means including a plurality of channels one of which is connected with said capacitor, an analog-to-digital converter connected with the output of said multiplexer, computer means responsive to the output of said analog-to-digital converter and providing a clearing signal in response to conversion of any one of said different voltages, semiconductor switch means responsive to said clearing signal for discharging said capacitor.

* * * * *